(12) United States Patent  (10) Patent No.: US 8,552,929 B2
Mittan et al.                (45) Date of Patent:   *Oct. 8, 2013

(54) FLEXIBLE PIXEL HARDWARE AND METHOD

(71) Applicant: Daktronics, Inc., Brookings, SD (US)

(72) Inventors: Thomas R. Mittan, Brookings, SD (US); Chad Neal Gloege, Brookings, SD (US); Brett David Wendler, Watertown, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/732,510

(22) Filed: Jan. 2, 2013

(65) Prior Publication Data
US 2013/0120395 A1    May 16, 2013

Related U.S. Application Data

(63) Continuation of application No. 13/360,187, filed on Jan. 27, 2012, now Pat. No. 8,363,038, which is a continuation of application No. 13/031,400, filed on Feb. 21, 2011, now Pat. No. 8,106,923, which is a continuation of application No. 10/965,133, filed on Oct. 14, 2004, now Pat. No. 7,893,948.

(51) Int. Cl.
G09G 3/20    (2006.01)
G09G 3/14    (2006.01)

(52) U.S. Cl.
CPC ........................................ *G09G 3/14* (2013.01)
USPC .................. 345/33; 345/441; 345/46; 345/36; 345/44

(58) Field of Classification Search
CPC ........................................................ G09G 3/14
USPC .................................. 345/33, 46, 36, 44, 441
See application file for complete search history.

(56) References Cited

U.S. PATENT DOCUMENTS 4,263,736 A   4/1981  Beierwaltes et al.
4,539,598 A   9/1985  Dietrich et al.
(Continued)

FOREIGN PATENT DOCUMENTS

AU    2003203350 A1    7/2003
AU    2005329700 B2    9/2006
(Continued)

OTHER PUBLICATIONS

"U.S. Appl. No. 12/987,584, Response filed Jan. 9, 2013 to Final Office Action mailed Oct. 12, 2012 and Advisory Action mailed Dec. 21, 2012", 12 pgs.

(Continued)

*Primary Examiner* — Javid A Amini
(74) *Attorney, Agent, or Firm* — Schwegman, Lundberg & Woessner, P.A.

(57) ABSTRACT

A graphical display station of arbitrary shape such as channel letters or other shaped structures is populated with pixels which are components of flexible pixel strings which can be arranged to fit the arbitrary shape(s). The flexible pixel strings provide for straightforward and cost effective fabrication of channel letter or other shaped displays. The invention also includes pixel units which comprise lighting elements together with such control circuits as are needed to roperly drive the lighting elements to form a graphical image. Addressing of the particular pixels is provided to accommodate the arbitrary arrangement of pixels of the flexible pixel strings. Methods of fabricating a channel letter display are also disclosed.

20 Claims, 12 Drawing Sheets

(56) References Cited

U.S. PATENT DOCUMENTS

| | | |
|---|---|---|
| 4,751,446 A | 6/1988 | Pineda et al. |
| 4,839,726 A | 6/1989 | Balopole et al. |
| 5,079,636 A | 1/1992 | Brody |
| 5,151,689 A | 9/1992 | Kabuto et al. |
| 5,164,853 A | 11/1992 | Shimazaki |
| 5,168,375 A | 12/1992 | Reisch et al. |
| 5,261,050 A | 11/1993 | Fox et al. |
| 5,363,318 A | 11/1994 | McCauley |
| 5,382,811 A | 1/1995 | Takahashi |
| 5,399,390 A | 3/1995 | Akins |
| 5,400,229 A | 3/1995 | Lin |
| 5,440,648 A | 8/1995 | Roberts et al. |
| 5,475,400 A | 12/1995 | Sellers et al. |
| 5,523,769 A | 6/1996 | Lauer et al. |
| 5,600,574 A | 2/1997 | Reitan |
| 5,642,125 A | 6/1997 | Silverstein et al. |
| 5,767,822 A | 6/1998 | Hiroshi |
| 5,796,376 A | 8/1998 | Banks |
| 5,805,117 A | 9/1998 | Mazurek et al. |
| 5,815,168 A | 9/1998 | May |
| 5,946,005 A | 8/1999 | Chiang |
| 5,949,483 A | 9/1999 | Fossum et al. |
| 5,949,581 A | 9/1999 | Kurtenbach et al. |
| 6,054,968 A | 4/2000 | De Matteo |
| 6,072,446 A | 6/2000 | Tokimoto |
| 6,169,632 B1 | 1/2001 | Kurtenbach et al. |
| 6,219,099 B1 | 4/2001 | Johnson et al. |
| 6,259,838 B1 | 7/2001 | Singh et al. |
| 6,265,984 B1 | 7/2001 | Molinaroli |
| 6,291,024 B1 | 9/2001 | Deroch et al. |
| 6,330,111 B1 | 12/2001 | Myers |
| 6,335,728 B1 | 1/2002 | Kida et al. |
| 6,362,801 B1 | 3/2002 | Yuhara |
| 6,400,340 B1 | 6/2002 | Nishida |
| 6,536,914 B2 | 3/2003 | Hoelen et al. |
| 6,538,375 B1 | 3/2003 | Duggal et al. |
| 6,566,824 B2 | 5/2003 | Panagotacos et al. |
| 6,628,258 B1 | 9/2003 | Nakamura |
| 6,639,574 B2 | 10/2003 | Scheibe |
| 6,729,054 B1 | 5/2004 | VanderTuin |
| 6,736,512 B2 | 5/2004 | Balogh |
| 6,809,390 B2 | 10/2004 | Toda et al. |
| 6,819,303 B1 | 11/2004 | Berger et al. |
| 6,842,164 B2 | 1/2005 | Imajo et al. |
| 6,856,303 B2 | 2/2005 | Kowalewski |
| 6,888,304 B2 | 5/2005 | Sato |
| 7,049,983 B2 | 5/2006 | Azami et al. |
| 7,091,927 B1 | 8/2006 | Hagge et al. |
| 7,148,944 B2 | 12/2006 | Kinoshita et al. |
| 7,161,558 B1 | 1/2007 | Eidem et al. |
| 7,165,863 B1 | 1/2007 | Thomas et al. |
| 7,295,362 B2 | 11/2007 | Meisburger |
| 7,417,251 B2 | 8/2008 | Iketsu et al. |
| 7,443,028 B2 | 10/2008 | Satou et al. |
| 7,492,091 B2 | 2/2009 | Kharrazi-Olsson et al. |
| 7,868,903 B2 | 1/2011 | Wendler et al. |
| 7,893,948 B1 | 2/2011 | Mittan et al. |
| 8,001,455 B2 | 8/2011 | Gloege et al. |
| 8,106,923 B2 | 1/2012 | Mittan et al. |
| 8,344,410 B2 | 1/2013 | Wendler et al. |
| 8,363,038 B2 | 1/2013 | Mittan et al. |
| 2001/0015709 A1 | 8/2001 | Imajo et al. |
| 2001/0049893 A1 | 12/2001 | Maas et al. |
| 2002/0000576 A1 | 1/2002 | Inukai |
| 2002/0051356 A1 | 5/2002 | Takahashi et al. |
| 2002/0088984 A1 | 7/2002 | Toda et al. |
| 2002/0122134 A1 | 9/2002 | Kalua |
| 2002/0145392 A1 | 10/2002 | Hair et al. |
| 2003/0031032 A1 | 2/2003 | Wu et al. |
| 2003/0034497 A1 | 2/2003 | Yamazaki et al. |
| 2003/0057886 A1 | 3/2003 | Lys et al. |
| 2003/0067437 A1 | 4/2003 | McClintock et al. |
| 2003/0076281 A1 | 4/2003 | Morgan et al. |
| 2003/0209714 A1 | 11/2003 | Taskar et al. |
| 2004/0004827 A1 | 1/2004 | Guest |
| 2004/0041800 A1 | 3/2004 | Daniels |
| 2004/0043139 A1 | 3/2004 | Daniels |
| 2004/0080262 A1 | 4/2004 | Park et al. |
| 2004/0207581 A1 | 10/2004 | Miller |
| 2004/0235227 A1 | 11/2004 | Kawase |
| 2004/0239586 A1 | 12/2004 | Cok |
| 2004/0253896 A1 | 12/2004 | Yamazaki |
| 2005/0030321 A1 | 2/2005 | Anwar |
| 2005/0040962 A1 | 2/2005 | Funkhouser et al. |
| 2005/0046646 A1 | 3/2005 | Tobita |
| 2005/0064685 A1 | 3/2005 | Hayakawa |
| 2005/0194898 A1 | 9/2005 | Kharrazi-olsson et al. |
| 2005/0225976 A1 | 10/2005 | Zampini et al. |
| 2005/0236640 A1 | 10/2005 | Guenther et al. |
| 2006/0039142 A1 | 2/2006 | Temple |
| 2006/0063027 A1 | 3/2006 | Vestweber et al. |
| 2006/0221599 A1 | 10/2006 | Hornsby et al. |
| 2006/0284161 A1 | 12/2006 | Tokida |
| 2007/0099401 A1 | 5/2007 | Tanaka |
| 2007/0148793 A1 | 6/2007 | Yoshida |
| 2008/0225143 A1 | 9/2008 | Joffer et al. |
| 2009/0021497 A1 | 1/2009 | Wendler et al. |
| 2009/0021529 A1 | 1/2009 | Wendler et al. |
| 2009/0021532 A1 | 1/2009 | Gloege et al. |
| 2009/0024867 A1 | 1/2009 | Gloege et al. |
| 2009/0024929 A1 | 1/2009 | Gloege et al. |
| 2009/0184984 A1 | 7/2009 | Takahara |
| 2009/0195154 A1 | 8/2009 | Yamazaki et al. |
| 2010/0265277 A1 | 10/2010 | Takahara |
| 2010/0277401 A1 | 11/2010 | Takahara et al. |
| 2011/0102307 A1 | 5/2011 | Wendler et al. |
| 2011/0141139 A1 | 6/2011 | Mittan et al. |
| 2012/0005563 A1 | 1/2012 | Gloege et al. |
| 2012/0032159 A1 | 2/2012 | Yamazaki et al. |
| 2012/0120033 A1 | 5/2012 | Mittan et al. |
| 2013/0002634 A1 | 1/2013 | Wendler et al. |

FOREIGN PATENT DOCUMENTS

| | | |
|---|---|---|
| EP | 0390479 A2 | 10/1990 |
| EP | 1655712 A2 | 5/2006 |
| GB | 2164189 | 3/1986 |
| GB | 2164189 A | 3/1986 |
| JP | 11191494 | 7/1999 |
| JP | 2005224983 A2 | 8/2005 |
| WO | WO-02073298 A2 | 9/2002 |
| WO | WO-02122134 A1 | 9/2002 |
| WO | WO-03060857 A1 | 7/2003 |

OTHER PUBLICATIONS

"3-channel constant-current LED Driver with PWM control", (A6280-DS, Rev. 3), Allegro Microsystems Inc, [online]. [archived May 7, 2007]. Retrieved from the Internet: <URL:http://web.archive.org/web/20070507171052/http://www.allegromicro.com/en/Products/Part_Numbers/6280/6280>, (May 7, 2007), 12 pgs.

"U.S. Appl. No. 10/965,133, Final Office Action mailed Nov. 17, 2009", 9 pgs.

"U.S. Appl. No. 10/965,133, Non Final Office Action mailed May 25, 2010", 10 pgs.

"U.S. Appl. No. 10/965,133, Non Final Office Action mailed Jun. 2, 2008", 5 pgs.

"U.S. Appl. No. 10/965,133, Non Final Office Action mailed Jul. 10, 2006", 5 pgs.

"U.S. Appl. No. 10/965,133, Non Final Office Action mailed Oct. 26, 2007", 6 pgs.

"U.S. Appl. No. 10/965,133, Notice of Allowance mailed Oct. 18, 2010", 7 pgs.

"U.S. Appl. No. 10/965,133, Response filed Jan. 10, 2007 to Non Final Office Action mailed Jul. 10, 2006", 9 pgs.

"U.S. Appl. No. 10/965,133, Response filed Feb. 14, 2008 to Non Final Office Action mailed Oct. 26, 2007", 16 pgs.

"U.S. Appl. No. 10/965,133, Response filed May 17, 2010 to Final Office Action mailed Nov. 17, 2009", 11 pgs.

"U.S. Appl. No. 10/965,133, Response filed Jun. 2, 2009 to Non Final Office Action mailed Jun. 2, 2008", 13 pgs.

"U.S. Appl. No. 10/965,133, Response filed Aug. 25, 2010 to Non Final Office Action mailed May 25, 2010", 8 pgs.

"U.S. Appl. No. 11/805,513, Advisory Action mailed Mar. 22, 2011", 3 pgs.

"U.S. Appl. No. 11/805,513, Final Office Action mailed Dec. 28, 2010", 11 pgs.

"U.S. Appl. No. 11/805,513, Non-Final Office Action mailed Apr. 28, 2010", 10 pgs.

"U.S. Appl. No. 11/805,513, Notice of Allowance mailed Apr. 6, 2011", 9 pgs.

"U.S. Appl. No. 11/805,513, Response filed Feb. 28, 2011 to Final Office Action mailed Dec. 28, 2010", 9 pgs.

"U.S. Appl. No. 11/805,513, Response filed Mar. 28, 2011 to Final Office Action mailed Dec. 28, 2010", 6 pgs.

"U.S. Appl. No. 11/805,513, Response filed Sep. 28, 2010 to Non Final Office Action mailed Apr. 28, 2010", 6 pgs.

"U.S. Appl. No. 11/895,423, Notice of Allowance mailed May 9, 2012", 7 pgs.

"U.S. Appl. No. 11/895,423, Response filed May 2, 2012 to Restriction Requirement mailed Apr. 2, 2012", 17 pgs.

"U.S. Appl. No. 11/895,423, Response filed Dec. 12, 2012 to Office Action mailed Nov. 29, 2012", 28 pgs.

"U.S. Appl. No. 11/895,423, Restriction Requirement mailed Apr. 2, 2012", 5 pgs.

"U.S. Appl. No. 11/895,424, Non Final Office Action mailed Mar. 12, 2010", 6 pgs.

"U.S. Appl. No. 11/895,424, Notice of Allowance mailed Sep. 10, 2010", 13 pgs.

"U.S. Appl. No. 11/895,424, Response filed Jun. 11, 2010 to Non Final Office Action mailed Mar. 12, 2010", 8 pgs.

"U.S. Appl. No. 12/987,584, Advisory Action mailed Dec. 21, 2012", 2 pgs.

"U.S. Appl. No. 12/987,584, Final Office Action mailed Oct. 12, 2012", 23 pgs.

"U.S. Appl. No. 12/987,584, Non Final Office Action mailed Sep. 6, 2012", 19 pgs.

"U.S. Appl. No. 12/987,584, Preliminary Amendment filed Feb. 28, 2011", 7 pgs.

"U.S. Appl. No. 12/987,584, Response filed Sep. 6, 2012 to Non Final Office Action mailed Jun. 6, 2012", 12 pgs.

"U.S. Appl. No. 12/987,584, Response filed Dec. 12, 2012 to Final Office Action mailed Oct. 12, 2012", 12 pgs.

"U.S. Appl. No. 13/031,400, Response filed Jul. 13, 2011 to Non Final Office Action mailed Apr. 14, 2011", 12 pgs.

"U.S. Appl. No. 13/031,400, Non Final Office Action mailed Apr. 14, 2011", 18 pgs.

"U.S. Appl. No. 13/031,400, Notice of Allowance mailed Sep. 23, 2011", 7 pgs.

"U.S. Appl. No. 13/360,187, Non Final Office Action mailed Jun. 15, 2012", 20 pgs.

"U.S. Appl. No. 13/360,187, Notice of Allowance mailed Sep. 17, 2012", 7 pgs.

"U.S. Appl. No. 13/360,187, Response filed Sep. 4, 2012 to Non-Final Office Action mailed Jun. 15, 2012", (Sep. 4, 2012), 7 pgs.

"U.S. Appl. No. 13/360,187, Response filed Sep. 4, 2012 to Non Final Office Action mailed Jun. 15, 2012", 19 pgs.

"European Application Serial No. 08795482.2, Office Action mailed Feb. 21, 2012", 27 pgs.

"European Application Serial No. 05256403.6, European Search Report mailed Oct. 5, 2006", 12 pgs.

"European Application Serial No. 05256403.6, Partial European Search Report dated Jun. 20, 2006", 4 pgs.

"European Application Serial No. 08165441.0, European Search Report dated Mar. 16, 2009", 5 pgs.

"European Application Serial No. 08165441.0, Response filed Sep. 27, 2010, Office Action Jan. 27, 2012", 20 pgs.

"European Application Serial No. 08795477.2, Amended Claims filed May 6, 2010", 5 pgs.

"European Application Serial No. 08795477.2, Office Action mailed Mar. 31, 2010", 1 pg.

"European Application Serial No. 08795477.2, Office Action mailed Jul. 2, 2012", 6 pgs.

"European Application Serial No. 08795477.2, Response filed Nov. 2, 2012 to Office Action mailed Jul. 2, 2012", 12 pgs.

"European Application Serial No. 08795482.2, Examination Report mailed Sep. 13, 2011", 12 pgs.

"European Application Serial No. 08795482.2, Extended European Search Report mailed Jan. 19, 2011", 12 pgs.

"European Application Serial No. 08795482.2, Response filed Jan. 4, 2012 to Office Action mailed Sep. 13, 2011", 12 pgs.

"European Application Serial No. 08795482.2, Response filed Aug. 2, 2011 to Communication dated Feb. 7, 2011", 14 pgs.

"European Application Serial No. 09250303.6, European Search Report mailed Mar. 16, 2009", 5 pgs.

"European Application Serial No. 08795477.2, Response filed Aug. 31, 2011 to Supplementary European Search Report mailed Apr. 18, 2011", 11 pgs.

"European Application Serial No. 08795477.2, Supplementary European Search Report mailed Apr. 18, 2011", 7 pgs.

"International Application No. PCT/US08/09936, International Preliminary Report on Patentability mailed Aug. 24, 2010", 6 pgs.

"International Application No. PCT/US08/09936, International Search Report mailed Nov. 10, 2008", 1 pg.

"International Application No. PCT/US08/09936, Written Opinion mailed Nov. 10, 2008", 3 pgs.

"International Application Serial No. PCT/US08/09941, International Search Report mailed Nov. 17, 2008", 1 pg.

"International Application Serial No. PCT/US08/09941, Written Opinion mailed Nov. 17, 2008", 6 pgs.

Baumann, P., "Management of Multidimensional Discrete Data", VLDB Journal, 3, (May 1994), 401-444.

Matkovic, K., "Tone Mapping Techniques and Color Image Difference in Global Illumination", Dissertation, (Feb. 18, 1998), 128 pgs.

Schwesig, C., et al., "Gummi: A Bendable Computer", Proceedings of the SIGCHI conference on Human factors in computing systems CHI '04, (Apr. 2004), 263-270.

Van Baar, J., et al., "Seamless Multi-Projector Display on Curved Screens", Proceedings of the Workshop on Virtual Environments 2003 EGVE '03, (May 2003), 281-286.

FLEXIBLE PIXEL HARDWARE AND METHOD

CROSS REFERENCES TO RELATED APPLICATIONS

This application is a continuation of and claims priority to U.S. patent application Ser. No. 13/360,187 filed Jan. 27, 2012, entitled "FLEXIBLE PIXEL HARDWARE AND METHOD", which is a continuation of and claims priority to U.S. patent application Ser. No. 13/031,400 filed Feb. 21, 2011, entitled "FLEXIBLE PIXEL HARDWARE AND METHOD," which is a continuation of and claims priority to U.S. patent application Ser. No. 10/965,133 filed Oct. 14, 2004, assigned U.S. Pat. No. 7,893,948, entitled "FLEXIBLE PIXEL HARDWARE AND METHOD," the entirety of which is explicitly incorporated by reference herein.

This application is also related to U.S. patent application Ser. No. 10/965,127 filed Oct. 14, 2004, entitled "FLEXIBLE PIXEL STRING SOFTWARE AND METHOD," now abandoned; U.S. patent application Ser. No. 11/805,513 filed May 23, 2007, entitled "TRANSLATION TABLE," which claims priority to U.S. Provisional Application Ser. No. 60/808,200 filed May 24, 2006, entitled "TRANSLATION TABLE"; U.S. patent application Ser. No. 11/895,423 filed Aug. 24, 2007, entitled "FLEXIBLE PIXEL ELEMENT AND SIGNAL DISTRIBUTION MEANS," which claims priority to U.S. Provisional Application Ser. No. 60/926,706 filed Apr. 27, 2007, entitled "FLEXIBLE PIXEL ASSEMBLIES FOR MOUNTING ON IRREGULAR SURFACES"; U.S. patent application Ser. No. 11/895,424 filed Aug. 24, 2007, issued as U.S. Pat. No. 7,868,903, entitled "FLEXIBLE PIXEL ELEMENT FABRICATION AND SEALING METHOD"; and U.S. patent application Ser. No. 12/987,584 filed Jan. 10, 2011, entitled "SEALED PIXEL ASSEMBLIES, KITS AND METHODS," which claims priority to U.S. Pat. No. 7,868,903, the entirety of each of the disclosures of which are explicitly incorporated by reference herein.

BACKGROUND OF THE INVENTION

1. Field of the Invention

The present invention relates to image displays and signage, and more particularly, to displays of custom or arbitrary shape. Such shaped displays include channel letter displays, logo or design displays, curved or round displays, or other arbitrary shaped or unusual aspect ratio displays.

2. Description of the Prior Art

Displays have become increasingly more sophisticated, progressing from monochrome incandescent and LED to color to moving or changing to video quality displays, and from smaller to larger size, and with more elaborate content and control and driving systems. Channel letter type displays have progressed from simple neon or fluorescent light displays to video type displays. The construction of modern video-type channel letter or arbitrary shaped displays is typically accomplished using standard rectangular grid video components. Such use of rectangular grid video components is awkward and wasteful, and in some implementations lacks the full desired effect that channel letter shaped video components could provide. However, the production of shaped video components in arbitrary shapes is expensive and inefficient at present. Further, the rectangular grid video components and control system can be inadequate for creating the custom shaped displays that are becoming increasingly desired. Thus, there is need for efficient and cost effective production of arbitrary shaped displays.

Definitions

By "addressing means" herein is meant hardware device for identifying a particular pixel, lighting element, or display element so that a display controller can send data to the particular pixel, lighting element, or display element among a group of multiple pixels, lighting elements, or display elements.

By "control circuit" herein is meant electronic circuit which receives data and changes the lighting output of one or more pixels or lighting elements.

By "display element" herein is meant a subsystem or portion of a display.

By "display" herein is meant a graphical image display device such as a video screen, electronic ticker, scoreboard, channel letter display, array or series of lights, visual output device.

By "flexible connection" herein is meant mounting, mechanical, or electrical components which attach to a pixel, lighting element, or display element to provide power, signal communication, or physical attachment.

By "lighting element" herein is meant components which generate or modify light, such as an LED, light bulb, neon light, phosphorescent component, cathode ray tube, liquid crystal display, backlight, laser, or optical fiber.

By "pixel string" herein is meant a set of pixels or other series of lighting elements.

By "pixel" herein is meant picture element, a set of one or more lighting elements which make up a single region of a graphical image.

By "power circuit" herein is meant an electric circuit which provides electrical power to drive one or more lighting elements.

SUMMARY OF THE INVENTION

The general purpose of the present invention is to provide a display in any arbitrary shape. Such a display can be useful for signage, presentation of video information, and so forth, in channel letters or other arbitrary shapes as are desired. Such a display could be adapted as a large graphical display, scoreboard, ticker, billboard, informational signage, or other configurations and applications. The flexible pixel string of the present invention is also well suited for other indoor or outdoor architectural lighting applications. For example, lighting elements mounted in a room, in, behind or on a wall, ceiling, floor, or divider, or lighting elements on a building or external structure, such as a walkway, pole or fence, could be configured with flexible pixel strings for efficient and versatile custom lighting effects. Flexible pixel strings can be used to locate lighting elements behind a glass wall, in ceiling tiles, in recessive fixtures, and so forth, providing individual access and control of individual lighting elements for specialized illumination effects or display of video data or other graphical information.

The basic concept underlying the present invention is similar to having a rope of decorative lights that would be mounted to a display of any shape, such as with the lights protruding through holes to be visible from the front of the display, and the flexible connections and wires hidden behind the display surface. By simply affixing the lights to any chosen locations on the display, any arbitrary shape can easily be fabricated.

According to one embodiment of the present invention, there is provided a video-capable display, including multiple pixels arranged in an arbitrary configuration, with lighting elements, control circuits, power circuits, and flexible connections.

According to another embodiment of the present invention, there is provided a flexible pixel string, including multiple control circuits, each driving at least one pixel, with flexible connections.

According to still another embodiment of the present invention, there is provided a display element, including a control circuit, at least one lighting element, addressing means and at least one flexible connection.

According to a further embodiment of the present invention, there is provided an electronic circuit which provides multiple levels of control for a pixel or other display element.

According to a still further embodiment of the present invention, there is provided a method of fabricating a flexible pixel string.

According to an additional embodiment of the present invention, there is provided a method of fabricating a display of arbitrary shape.

According to another additional embodiment of the present invention, there is provided a method of addressing a particular pixel on a flexible pixel string.

One significant aspect and feature of the present invention is the efficient utilization of the minimum number of lighting elements and other costly electronic components.

Another significant aspect and feature of the present invention is the flexible pixel string which provides for production of displays of any arbitrary shape.

Still another significant aspect and feature of the present invention is the multiple display elements which provide for distributed control of pixels and lighting elements.

Yet another significant aspect and feature of the present invention is the multiple electronic circuits providing individual control of a pixel or other display element.

A further significant aspect and feature of the present invention is the flexible connections which provide for any arbitrary arrangement of pixels or display elements.

A still further significant aspect and feature of the present invention is the addressing means for identifying a particular pixel or display element for activating the particular pixel or display element in the desired manner and timing even if the pixel or display element is part of a flexible pixel string with arbitrary shape and not part of a regular rectangular grid or array.

Having thus described embodiments of the present invention, it is the principal object of the present invention to provide a display in any arbitrary shape. Such a display can be useful for signage, presentation of video information, and so forth, in channel letters or other arbitrary shapes as are desired.

One object of the present invention is to provide an efficient and cost effective display.

Another object of the present invention is to provide a display with moving video capabilities.

Yet another object of the present invention is to provide displays that are curved, angled, channel letter, logo shaped, or otherwise shaped.

Still another object of the present invention is to provide a flexible pixel string which can be used as a component in a display with arbitrary shape.

A further object of the present invention is to provide a simple electronic circuit which can be used to control a single pixel or other display element.

A still further object of the present invention is to provide for addressing a particular pixel on a flexible pixel string.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
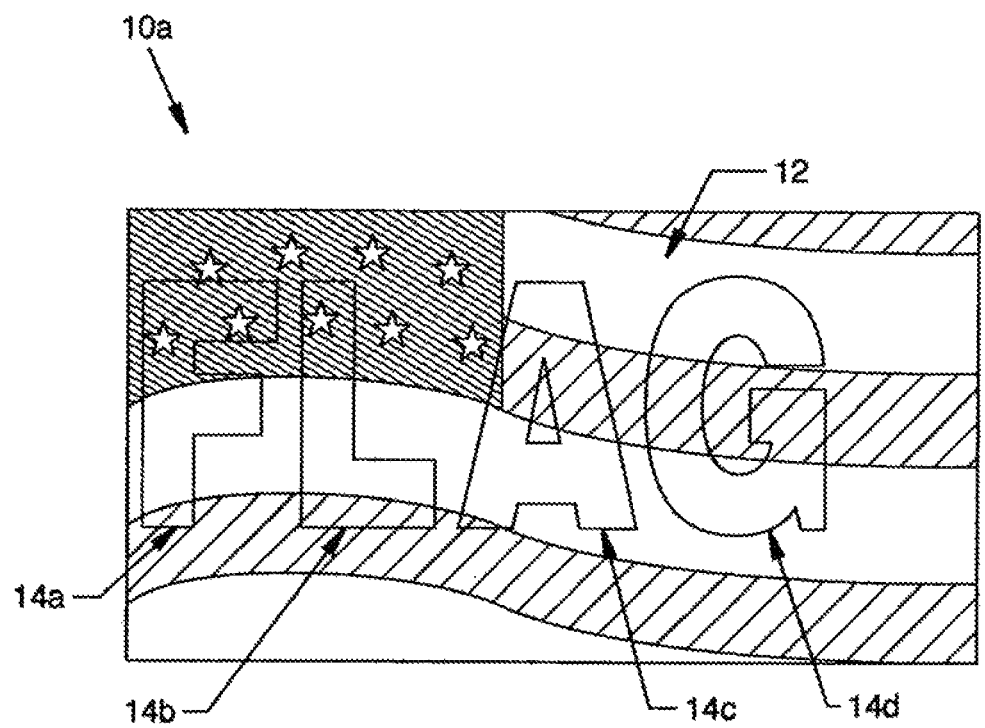
FIG. 1 illustrates a prior art display.
Figure 2:
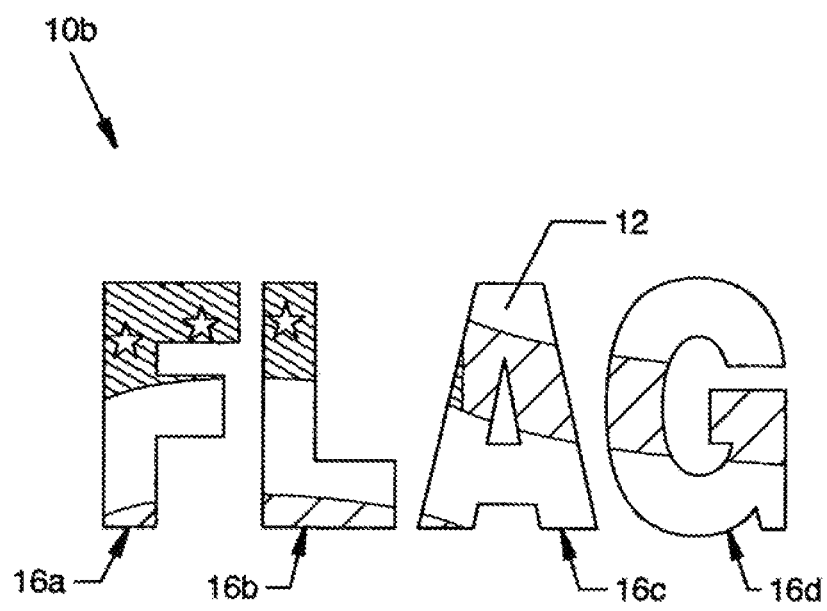
FIG. 2 illustrates a prior art display.

FIG. 1 and FIG. 2 illustrate prior art displays. Display 10*a* is a prior art rectangular grid display. Graphical image 12 fills display 10*a*. Letter shapes 14*a*-14*d* are displayed in an attempt to have the visual effect of a channel letter display. A display of this type lacks the visual effect of a true channel letter display. This prior art approach starts with display 10*a* and covers or removes those portions that are outside of letter shapes 14*a*-14*d*. In FIG. 2, still another prior art approach is to fabricate channel letters 16*a*-16*d* using rectangular grid components. These alternate prior art approaches might produce channel letter displays with the general appearance of FIG. 2, which illustrates a display 10*b* having channel letters 16*a*-16*d* and displaying graphical image 12. These alternate prior art approaches require significant custom fabrication and are not always even feasible, depending on the particular display type.

Figure 3:
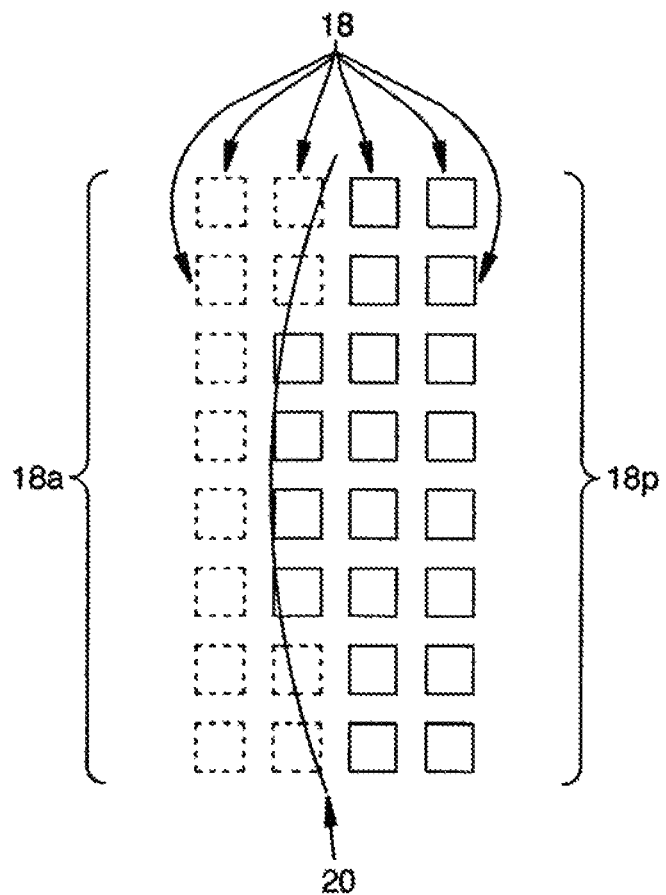
FIG. 3 illustrates an enlarged portion of the channel letter display of FIG. 2.

FIG. 3 illustrates an enlarged portion of the prior art display 10*b* of FIG. 2. A rectangular grid of pixels 18 is shown, with pixels 18*p* present in the display 10*b* (shown with solid lines), and pixels 18*a* which are absent or have been removed or covered (shown with dashed lines). Line 20 indicates the desired edge of a channel letter 16 of display 10*b*.

Figure 4:
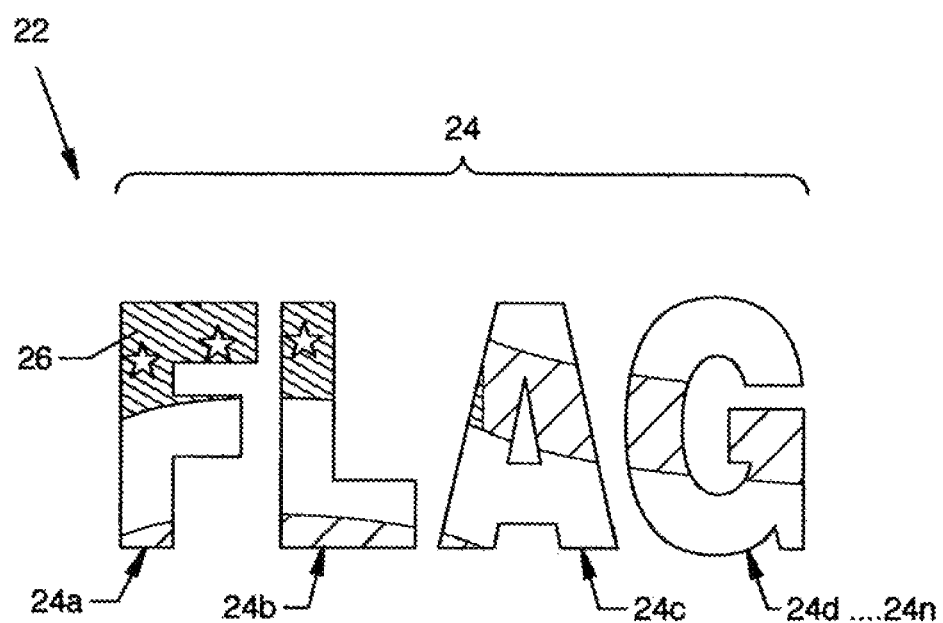
FIG. 4 illustrates a channel letter display with flexible pixel strings, the present invention.

FIG. 4 illustrates a channel letter display 22 with flexible pixel strings, the present invention, including shaped structure(s) 24. Although appearing similar to the prior art display of FIG. 2, the display of FIG. 4 is distinct in the manner in which it is produced and due to the presence of flexible pixel strings instead of prior art rectangular gridded pixels. Illustrated shaped structure(s) 24 can be channel letters 24*a*-24*d* or can be logo shapes, figure shapes, circular or curved shapes or sections, linear shapes, outlines, patterns, or combinations thereof. Channel letters 24*a*-24*d* spelling a company name, product name, place name, or other word or phrase may be desired. The channel letter display 22 can be a single shaped structure or can be multiple shaped structures 24, as shown. In this example, the shaped structures 24 are channel letters 24a-24d and the word "flag" is used for the channel letters 24a-24d and a graphical image 26 of a flag fills channel letters 24a-24d. In use, graphical image 26 may be any variety of images, designs, and so forth. For example, a moving (or animated) video image of a flag waving in the breeze could be "played" on channel letter display 22.

Figure 5:
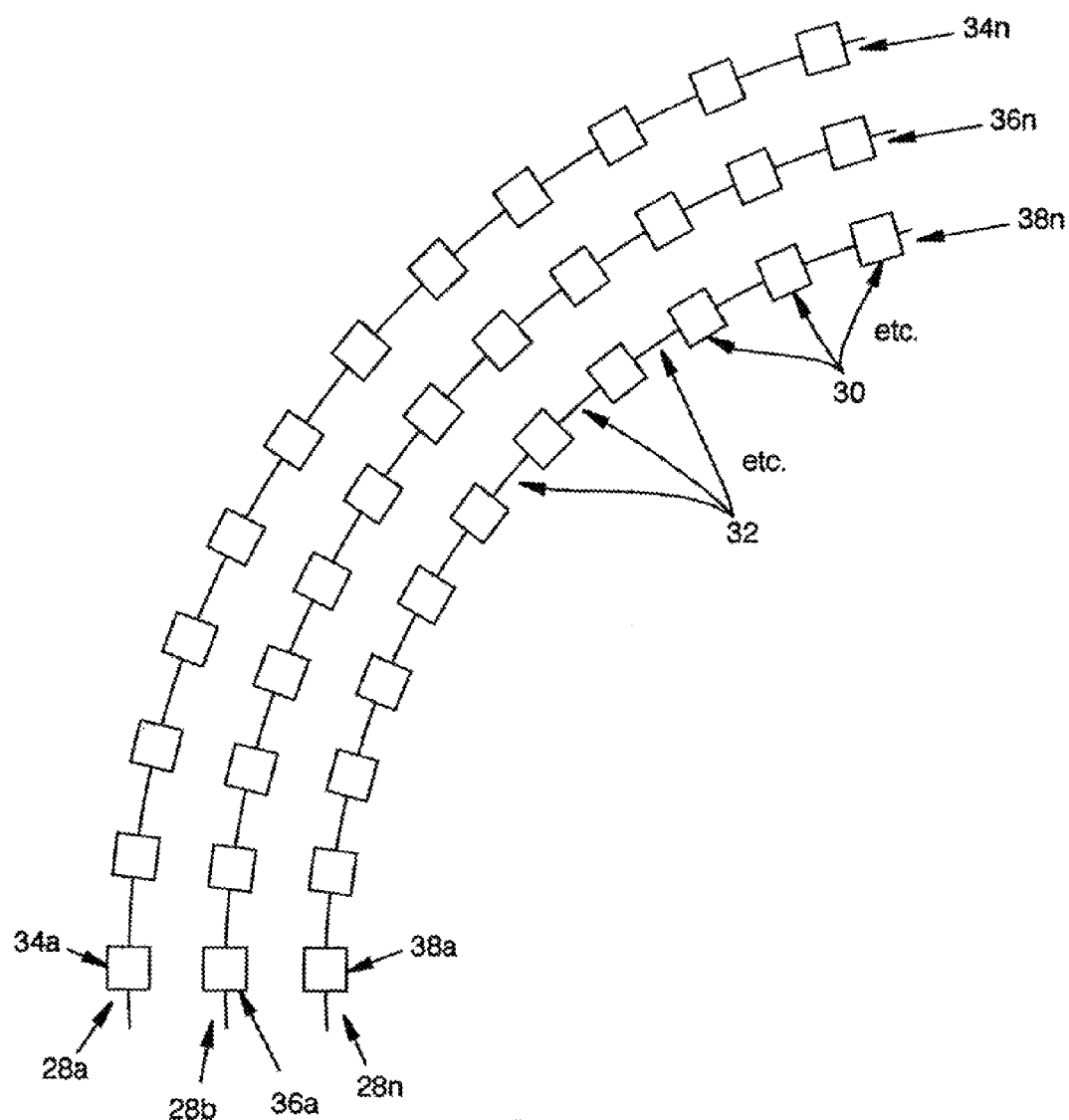
FIG. 5 illustrates an enlarged portion of the channel letter display of FIG. 4.

FIG. 5 illustrates an enlarged portion of the channel letter display 22 of FIG. 4. Portions of three flexible pixel strings 28a, 28b and 28n are shown. Each channel letter 24a-24d comprises at least one pixel 30, but typically comprises many pixels. The individual pixels in each channel letter 24a-24d are in flexible pixel strings 28a-28n which are curvilinear strings with flexible connections 32 and arranged, by individual strings or group of strings, to form the shape of the channel letter or shaped structure(s) 24. Any convenient number of pixels 30 can be used in the flexible pixel strings 28a-28n, and the number of pixels can vary from string to string.

Flexible pixel string 28a comprises pixels 34a-34n where n is the number of pixels in the flexible pixel string 28a. Similarly, flexible pixel string 28b comprises a number of pixels 36a-36n, where the number of pixels may be the same as or different from the number of pixels in flexible pixel string 28a. Still similarly, flexible pixel string 28n comprises a number of pixels 38a-38n, where the number of pixels may be the same as or different from the number of pixels in flexible pixel strings 28a and 28b. The flexible pixel strings 28a-28n may be formed into lines, curves, zig zags, or other pattern or shape as needed to form the channel letter or shaped structure 24 as desired, and the flexible pixel strings 28a-28n may terminate at any point within or at the periphery of the channel letter or shaped structure.

Figure 6:
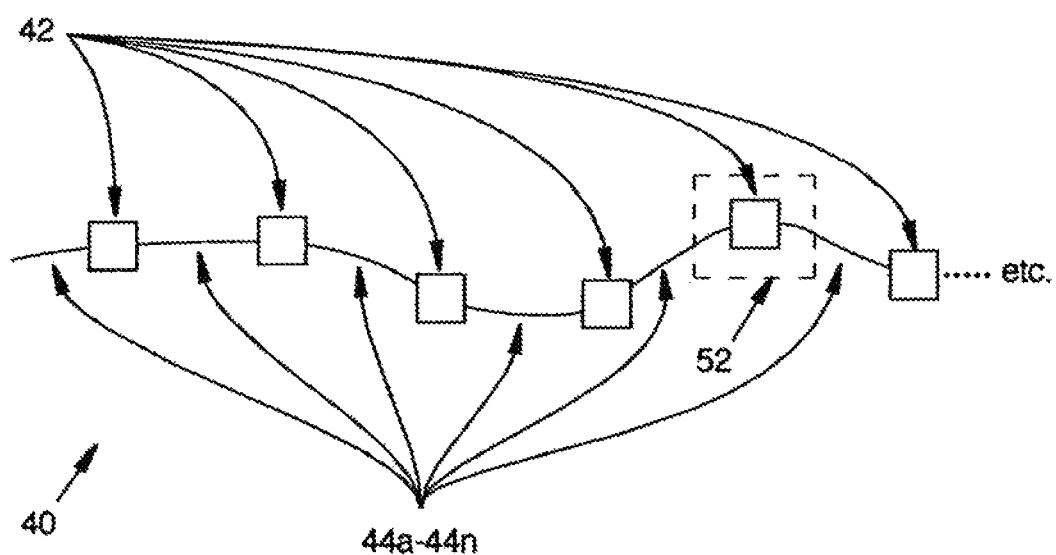
FIG. 6 illustrates a flexible pixel string.
Figure 7:
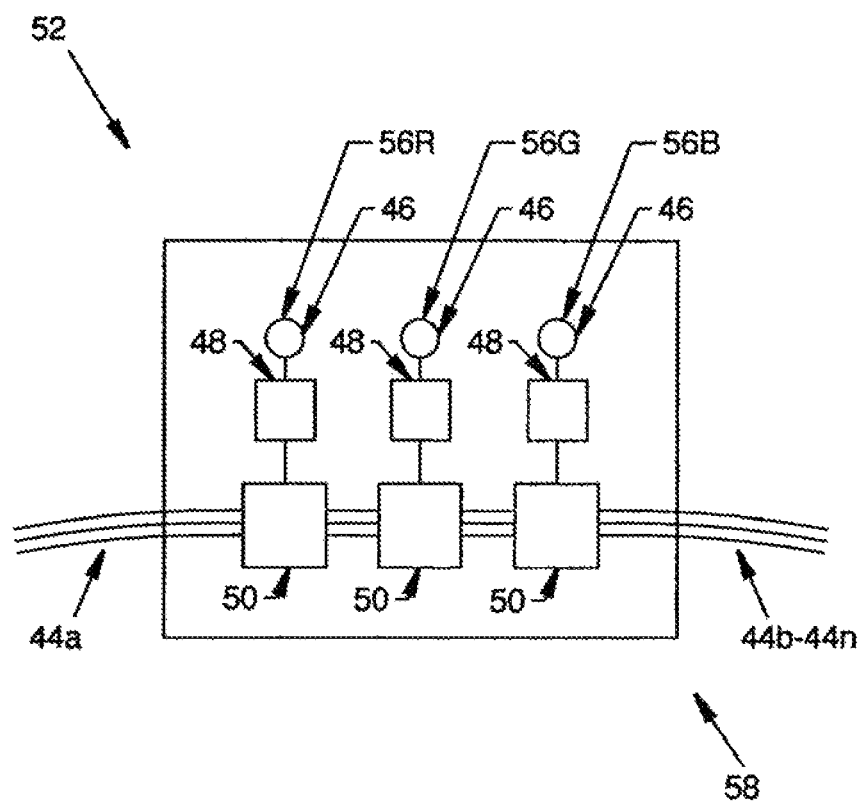
FIG. 7 illustrates schematically a pixel unit of FIG. 6.

FIG. 6 and FIG. 7 illustrate a flexible pixel string 40, similar to flexible pixel strings 28a, 28b and 28n of FIG. 5. Flexible pixel string 40 comprises at least one pixel 42 and at least one flexible connection 44a-44n. Preferably, the flexible pixel string 40 has multiple pixels 42 as shown. Each pixel 42 has lighting element(s) 46 (FIG. 7) as required for the type of display; for example, red, green, and blue light emitting diodes (LEDs) (i.e., 56R, 56G, 56B, respectively) with drive circuits 48 and control circuits 50 which could be combined into pixel unit 52 and connected with flexible connections 44a-44n. Other types of lighting elements with appropriate drive circuits could be used, such as incandescent or other lights, lasers, monochrome lights, liquid crystal elements, and so forth.

In the preferred embodiment, for each pixel 42, a simple control circuit 50 is included, physically attached to the pixel 42. Each flexible pixel string 40 has one or more control circuit 50/lighting element(s) 46 combinations connected in series by flexible connections 44a-44n. Flexible connections 44a-44n include electrical, data, or activation connections which pass electrical power, graphical image data, or other activation mechanism to and from the pixel units 52. Flexible connections 44a-44n also include mounting or attachment connections which provide for the pixel unit 52 to be affixed in the desired arbitrary location. A single component flexible connections 44a-44n may provide both the data connection and the mounting connection, or multiple flexible connections 44a-44n may be used, distributing the data connection, mounting connection, and other connection functions among the multiple flexible connections 44a-44n.

FIG. 7 illustrates schematically a pixel unit 52 of FIG. 6. This example indicates lighting elements 46 which comprise red LED 56R, green LED 56G, and blue LED 56B. Each LED has a corresponding LED drive circuit 48. Each drive circuit 48 has a corresponding control circuit 50 which receives data from and through a flexible connection, for example, flexible connection 44a. If pixel unit 52 is not the last pixel unit in the flexible pixel string 40, then control circuit 50 also passes data to flexible connection 44b. In this example, flexible connection 44a and flexible connection 44b include data cables which pass image data, clock or timing signals, data latch signal, and may pass other data or electrical power as well. Control circuit 50 includes logic elements as are needed to properly activate the corresponding LED 56R, 56G or 56B, such as comparitors, counters, clocks, timers, latches, and so forth, by creating, for example, a pulse width modulation (PWM) function used to control the lighting intensity, duration, and timing for the corresponding LED. An integrated circuit 58 which comprises some or all of the elements of pixel unit 52 can be used advantageously to provide for easy and cost effective fabrication of shaped structure(s), including channel letters 24a-24d, in display 22, such as that of FIG. 4.

Figure 8:
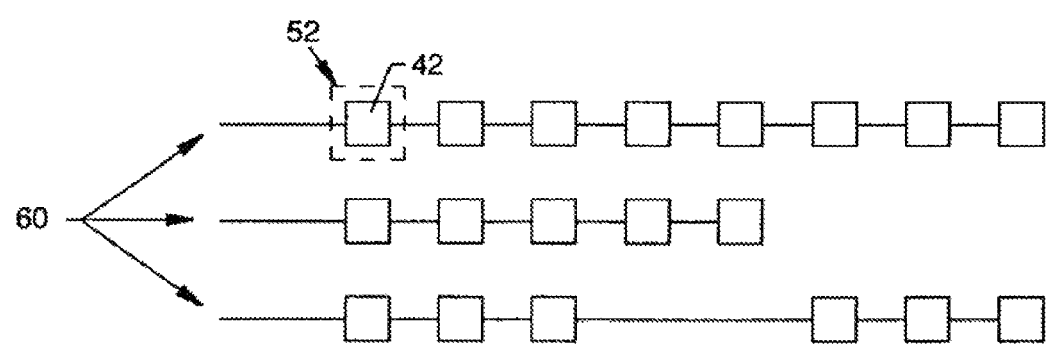
FIG. 8 illustrates prefabricated flexible pixel strings.

FIG. 8 illustrates standard or prefabricated pixel strings 60 with particular numbers and spacing of pixels 42 to facilitate construction of one or more channel letters 24a-24n of the shaped structure display 24. One would simply choose appropriate pixel strings to combine into the particular channel letter or shaped structure being constructed.

Figure 9:
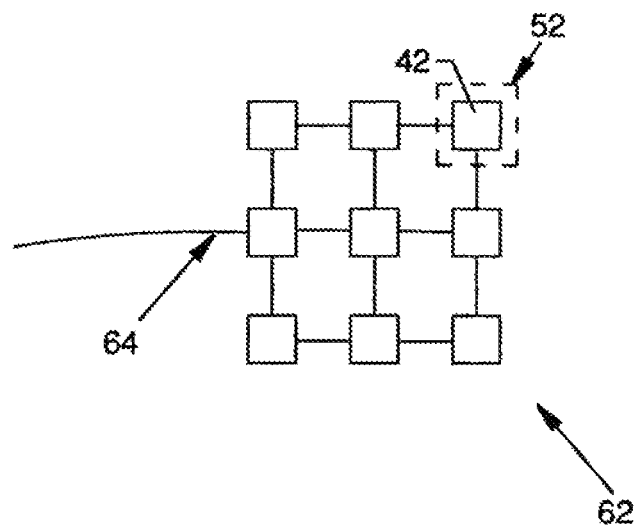
FIG. 9 illustrates a display element.

FIG. 9 illustrates display element 62. Display element 62 has some similarity to the prefabricated pixel string 60, but utilizes arrangements which could be a conventional rectangular grid of pixels 42 and pixel units 52 or arbitrary shaped pixel units 52 but with at least one flexible connection 64. Thus, the display element 62 may be positioned and oriented as needed to form a desired shaped structure 24, but does not have exclusively flexible connections between each pixel unit 52. The entire display element 62 is then used as a component, and multiple display elements 62 are used to create a shaped structure display 24 which could include a channel letter 24a-24d or which could be of some other shape.

Figure 10:
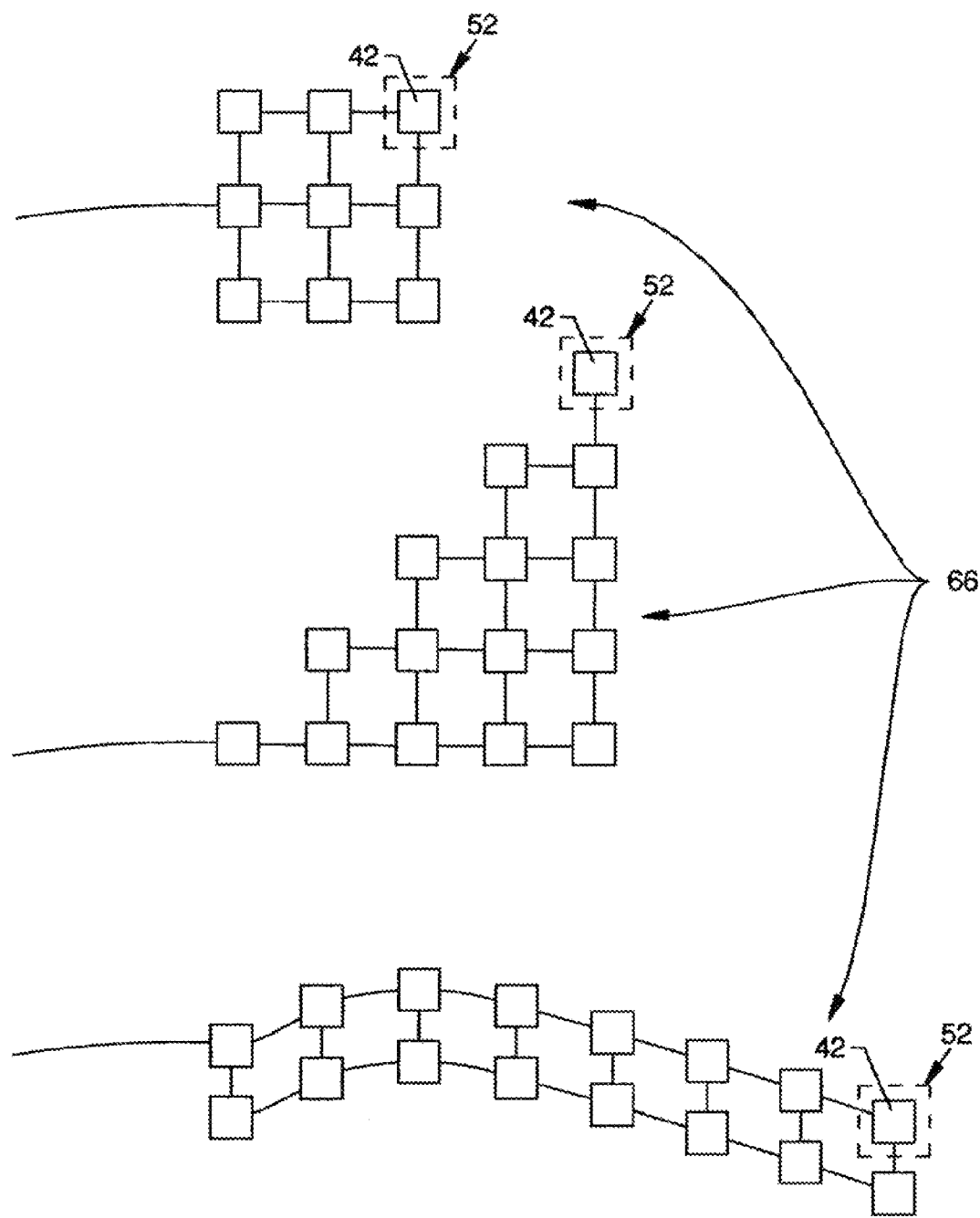
FIG. 10 illustrates prefabricated display elements.

FIG. 10 illustrates prefabricated display elements 66 with particular numbers and orientation of pixels 42 and pixel units 52 to facilitate construction of a shaped structure display 24 which can include a channel letter 24a-24d. One would simply choose appropriate display elements 66 to combine into the shaped structure 24 being constructed. A particularly advantageous approach is to utilize prefabricated display elements 66 together with flexible pixel strings 40 or prefabricated flexible pixel strings 60 to construct a shaped structure display 24 quickly and cost effectively. An additional advantageous aspect of the present invention is that the display element can be easily scaled up or scaled down in size and number of pixels. For example, the pixel unit or display element may comprise one full-color RGB or monochrome lighting element, or it can be scaled up so that each element on the flexible pixel string is an array of pixels. For instance, 2×2, 3×3, 4×4, 8×8, 16×16, 32×32, or other sized array of pixels or lighting elements can be incorporated or substituted for individual pixels or display elements. A large outdoor display could then comprise a string of large pixel arrays. The present invention provides for the utilization of large or small or intermixed pixel arrays or other shaped display elements. A particular flexible pixel string could incorporate a single pixel, a 4×4 pixel array, and a 32×32 pixel array, on the same pixel string. The hardware protocol is optimized to allow such variation, and corresponding software is optimized to enable such variation and substitution by allowing a library of pixel arrays and display elements to be created and saved. One may then simply choose and select the different pixel arrays and display elements desired, aided by software tools.

Figure 11:
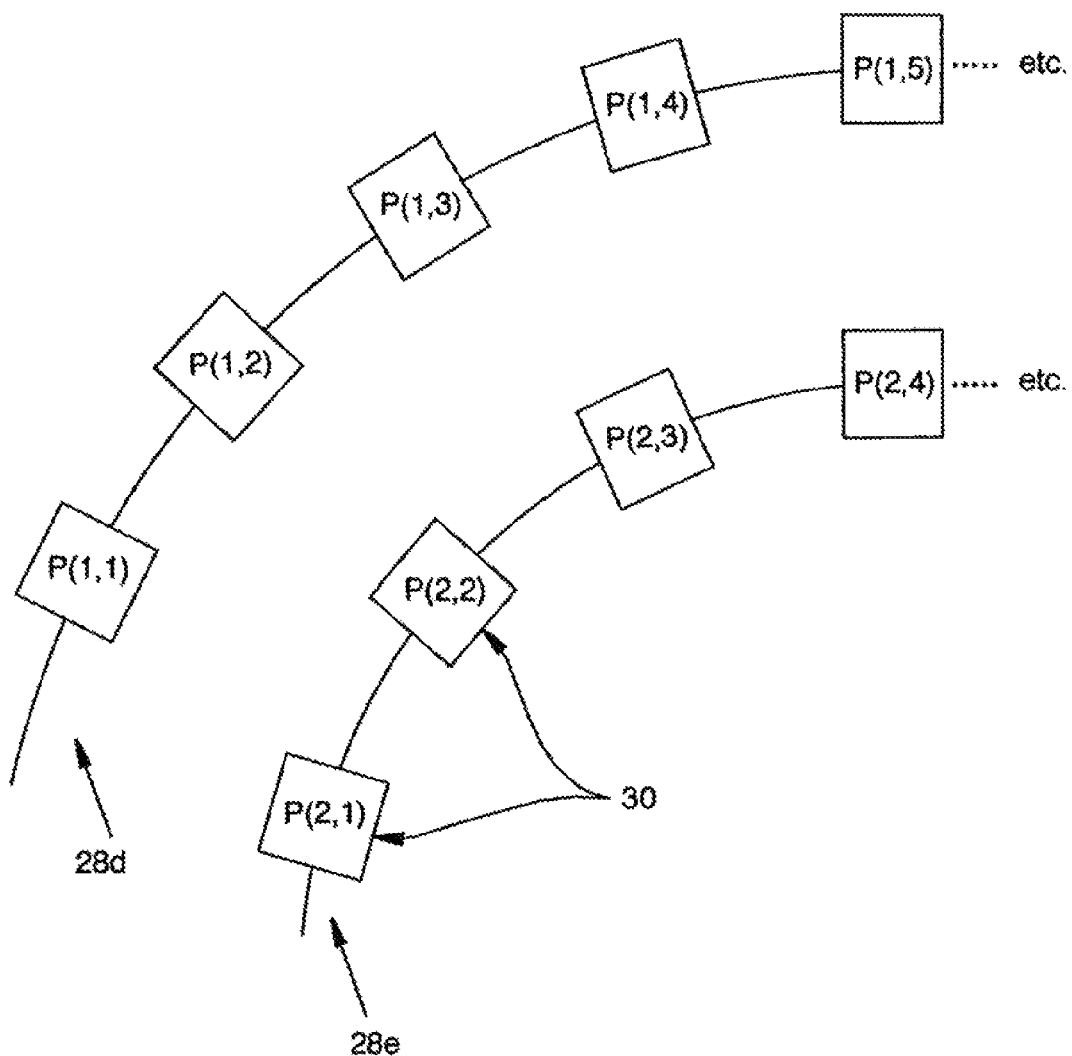
FIG. 11 illustrates schematically the addressing of pixels.

FIG. 11 illustrates schematically the addressing of pixels. Portions of flexible pixel strings 28d and 28e of channel letter display 22 are shown. Flexible pixel strings 28d and 28e are assigned a logical row to identify each flexible pixel string 28d and 28e. Within each flexible pixel string 28d and 28e, each pixel 30 is assigned a logical column to uniquely address each pixel 30. In this manner, each pixel 30 is uniquely addressable so that display controller 68 (FIG. 12) can send an image data set which will pass the appropriate image data to each pixel 30 to create a desired image even though the pixels 30 are not arranged in a standard rectangular grid arrangement. Pixels 30 on FIG. 11 are further denoted by the letter "P" in the form P (r, c), where r and c indicate a unique address.

Graphical image data 72 can be mapped from a standard rectangular array onto the logical row and logical column arrayed flexible pixel string 28a-28b by software. The software can accommodate scaling of data from single pixels to larger pixel arrays, such as 2×2 or 32×32 or other size pixel array, and may provide for creation and use of a library of pixel arrays and other display elements, and assist a user in selecting display elements and performing the image data mapping for the chosen display elements. Data, typically including graphical image data 72, timing data, and addressing data, are sent from display controller 68 to the shaped structure display 22, so that the shaped structure display 22 can display graphical image 26 as desired. Data sent to the shaped structure display 22 can comprise any variety of information, but typically includes any combination of color, hue, intensity, duration, timing, clock signal, and addressing data.

Mode of Operation

Figure 12:
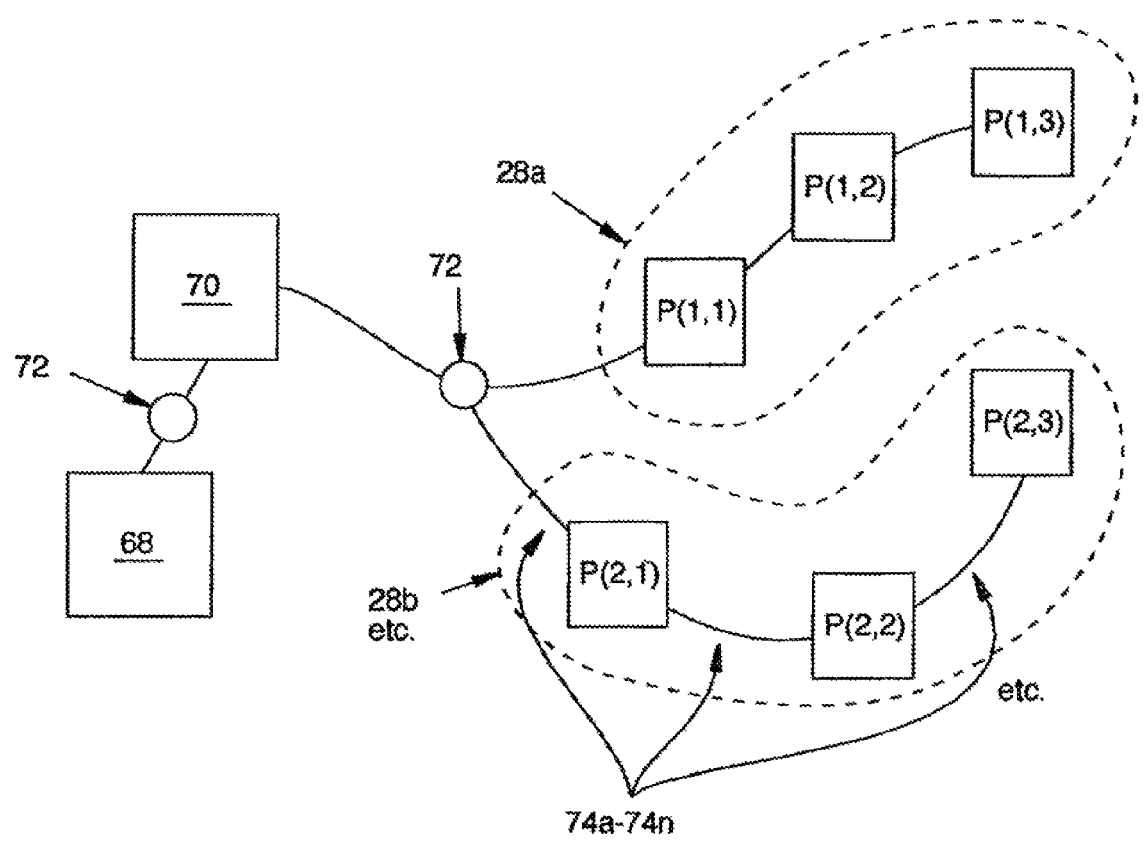
FIG. 12 illustrates schematically the operation of a graphical display station with channel letter or shaped structure display(s) having flexible pixel strings.

FIG. 12 illustrates schematically the operation of a graphical display station with shaped structure display(s) 22 having flexible pixel strings 28a-28n. Display controller 68, which may receive data from any data source (not shown), sends corresponding graphical image data 72 to software 70 which maps the graphical image data 72 onto logical rows and columns of pixels P(1,1) to P(n,m) where n refers to the number of logical rows and m refers to the number of logical columns in each logical row. Note that the number of logical columns may vary among the various logical rows. Graphical image data 72 passes via flexible connections 74a-74n to pixels P(1,1) to P(n,m) of flexible pixel strings 28a-28n. Pixels P(1,1) to P(n,m) comprise pixel units 52 which comprise control circuits 50 and lighting elements 46, as previously described in FIG. 7. Control circuits 50 receive graphical image data 72 and cause lighting elements 46 to activate at the lighting color, intensity, and timing corresponding to the graphical image data 72 for the particular pixel. Graphical image data 72 passes via the next flexible connections 74a-74n to the next pixel units in the flexible pixel strings 28a-28n and so forth so that every pixel unit in every flexible pixel string receives graphical image data 72 and activates accordingly to create graphical image 26.

The foregoing description and accompanying drawings is offered as illustration of the invention and not as a limitation. The scope of the invention is intended to be defined by the following claims and equivalents. One of ordinary skill in the art will appreciate that other variations and modifications of the invention described herein can be included within the scope of the present invention. Various features of the invention are grouped together in the several embodiments for illustration; this grouping is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Various modifications can be made to the present invention without departing from the apparent scope thereof.

It is claimed:

1. A graphical display assembly, comprising:
   a plurality of flexible pixel strings, each flexible pixel string including:
      a plurality of pixel units each including an array of lighting elements, each lighting element assigned an individual address corresponding to a flexible pixel string and a pixel unit, on which the lighting element is located, and a position of the lighting element on the pixel unit; and
      one or more flexible connections connecting the plurality of pixel units, the one or more flexible connections including a data connection configured to pass graphical image data to and from one or more of the pixel units;
   a software module configured to map the graphical image data onto the individually addressed lighting elements in order to create a desired graphical image; and
   a display controller operable to pass the graphical image data through the flexible pixel strings via the one or more flexible connections such that the lighting elements in the pixel units receive individually addressed graphical image data.

2. The graphical display assembly of claim 1, wherein the plurality of flexible pixel strings is arranged so that the plurality of pixel units defines an arbitrary shaped display.

3. The graphical display assembly of claim 2, wherein the arbitrary shaped display is configured to present multicolor, moving images.

4. The graphical display assembly of claim 2, wherein the arbitrary shaped display is non-rectangular.

5. The graphical display assembly of claim 1, wherein a first one of the flexible pixel strings includes a number of pixel units that is different than a number of pixel units included in a second one of the flexible pixel strings.

6. The graphical display assembly of claim 1, wherein the lighting elements of each pixel unit comprise at least one red LED, at least one green LED, and at least one blue LED.

7. The graphical display assembly of claim 1, wherein each pixel unit includes at least one control circuit.

8. The graphical display assembly of claim 1, wherein each pixel unit includes at least one control circuit electrically connected to the lighting elements of the pixel unit.

9. The graphical display assembly of claim 8, wherein each lighting element is electrically connected to a separate one of a plurality of drive circuits, wherein the plurality of drive circuits are electrically connected to the at least one control circuit.

10. The graphical display assembly of claim 1, wherein the pixel units of each flexible pixel string are serially connected.

11. The graphical display assembly of claim 1, wherein at least one of the flexible pixel strings includes pixel units that are connected in series and in parallel.

12. The graphical display assembly of claim 1, wherein at least one of the flexible pixel strings includes pixel units arranged in a grid pattern.

13. A method of fabricating a graphical display, the method comprising:
   providing or receiving a plurality of pixel units each including an array of lighting elements;
   connecting the plurality of pixel units with one or more flexible connections to form one or more flexible pixel strings;
   providing or receiving a software module for mapping graphical image data onto individually addressed lighting elements, each address associated with a flexible pixel string and a pixel unit on which each lighting element is located and a position of the lighting element on the pixel unit, in order to create a desired graphical image; and providing or receiving a display controller for passing the graphical image data through the one or more flexible pixel strings via the one or more flexible connections such that the lighting elements in the flexible pixel strings receive individually addressed graphical image data.

14. The method of claim 13, further comprising positioning the pixel units of at least one flexible pixel string into a non-grid-like pattern to define an arbitrary shaped display.

15. The method of claim 13, wherein connecting the plurality of pixel units comprises serially connecting the pixel units in each of the one or more flexible pixel strings.

16. The method of claim 13, wherein connecting the plurality of pixel units includes establishing a data connection configured to pass the graphical image data to and from one or more of the pixel units.

17. The method of claim 13, wherein providing or receiving the plurality of pixel units includes providing or receiving a plurality of pixel units, each pixel unit including at least one control circuit and a plurality of drive circuits.

18. A method of operating a display, the method comprising:
- individually addressing a location of each lighting element of a plurality of lighting elements included in each of a plurality of pixel units of one or more flexible pixel strings, including associating each address with a flexible pixel string and a pixel unit, on which each lighting element is located, and a position of the lighting element on the pixel unit;
- mapping graphical image data onto the individually addressed lighting elements; and
- transmitting the graphical image data through the one or more flexible pixel strings to each of the individually addressed lighting elements such that the lighting elements in the flexible pixel strings receive individually addressed graphical image data to create a desired graphical image.

19. The method of claim 18, wherein transmitting the graphical image data through the one or more flexible pixel strings includes transmitting the graphical image data through one or more flexible connections connecting the pixel units of each flexible pixel string.

20. The method of claim 19, wherein transmitting the graphical image data comprises transmitting the graphical image data, via the one or more flexible connections, to at least one control circuit of each pixel unit and transmitting the graphical image data to a drive circuit coupled to the at least one control circuit.

* * * * *